United States Patent [19]

Sekiba

[11] Patent Number: 5,422,314

[45] Date of Patent: Jun. 6, 1995

[54] LEAD FRAME AND PRODUCTION METHOD FOR PRODUCING SEMICONDUCTOR DEVICE USING THE LEAD FRAME

[75] Inventor: Takashi Sekiba, Shibata, Japan

[73] Assignee: Fujitsu Miyagi Electronics Ltd., Shibata, Japan

[21] Appl. No.: 165,466

[22] Filed: Dec. 13, 1993

[30] Foreign Application Priority Data

Mar. 19, 1993 [JP] Japan .................. 5-060639

[51] Int. Cl.6 .......................................... H01L 21/60
[52] U.S. Cl. .................... 437/220; 437/209; 437/214; 437/217; 437/219
[58] Field of Search ............ 437/209, 214, 215, 216, 437/217, 219, 220; 257/666, 670, 674

[56] References Cited

U.S. PATENT DOCUMENTS

| | | | |
|---|---|---|---|
| 4,920,074 | 4/1990 | Shimizu et al. | 437/217 |
| 5,083,186 | 1/1992 | Okada et al. | 437/220 |
| 5,100,498 | 3/1992 | Takeuchi et al. | 437/220 |
| 5,104,827 | 4/1992 | Schneider et al. | 437/214 |
| 5,230,144 | 7/1993 | Ootsuki | 437/220 |
| 5,336,272 | 8/1994 | Tsutsumi et al. | 437/214 |

FOREIGN PATENT DOCUMENTS 1-175250 7/1989 Japan .

*Primary Examiner*—Brian E. Hearn
*Assistant Examiner*—Kevin M. Picardat
*Attorney, Agent, or Firm*—Staas & Halsey

[57] ABSTRACT

A lead frame includes a die pad on which a semiconductor chip is mounted, a plurality of leads each having an end which faces the die pad, and tie bars connecting the leads, wherein each of the tie bars is formed so as to project from a surface of each of the leads by an amount sufficient to break a boundary between a tie bar and a Lead when the tie bar is pushed back so that the tie bar and lead is separated. The method for producing a semiconductor device using the above lead frame includes steps of clamping by molding dies the lead frame having the semiconductor chip mounted on the die pad so that the tie bar is pushed back and cut off and encapsulating the semiconductor chip by resin so that a package made of the resin is formed, and releasing the lead frame from clamping by the molding dies and removing the tie bar pushed back by the clamping from the lead frame.

3 Claims, 8 Drawing Sheets

LEAD FRAME AND PRODUCTION METHOD FOR PRODUCING SEMICONDUCTOR DEVICE USING THE LEAD FRAME

BACKGROUND OF THE INVENTION

1. Field of the Invention

The present invention generally relates to a lead frame and a production method for producing a semiconductor device using the lead frame, and more particularly to a lead frame in which tie bars connecting leads can be removed in a resin encapsulation process for a semiconductor device and a production method for producing a semiconductor device using the lead frame.

A semiconductor device (hereinafter referred to as an IC) is produced using a lead frame. The lead frame has tie bars connecting leads to prevent resin from leaking from molding dies in a resin encapsulation process in which a semiconductor chip is molded by resin. Thus, after the resin encapsulation process for this type of semiconductor device, the tie bars must be cut off from the lead frame. It is preferable for the tie bars to be precisely removed from the lead frame.

2. Description of the Related Art

An IC using a conventional lead frame is encapsulated by resin as shown in FIG. 1. Referring to FIG. 1, a lead frame 20 projects from both sides of a package 10 made of resin. The lead frame 20 has leads 22 arranged at predetermined intervals and tie bars 21 connecting the leads 22. In each space 15 surrounded by a lead 22, a tie bar 21 and the side surface of the package 10, resin is leaked from the cavity of the molding dies and is hardened, so that resin burr(dam burr made of a thin resin film) is formed in the resin encapsulation process.

After the resin encapsulation process, the tie bars 21 are cut off by a punching machine as shown in FIG.2 so that the leads 22 are separated from each other. That is, the lead frame 20 set on a lower die 32 is punched by a punching die 31 so that the tie bars 21 are removed from the lead frame 20. In the punching machine, the conveying of the lead frame 20 and a punching action are alternately performed so that a predetermined number of the tie bars 21 are removed from the lead frame 20 in each punching action.

In a case, as has been described above, where the tie bars 22 are cut off from the lead frame after the resin encapsulation process, the tie bars 21 may not be precisely cut off due to the nonuniformity of thermal contraction of the lead frame 20 and/or a discrepancy between the lead frame 20 and the punching die in the punching machine. Increasing the integration degree of the IC so that the intervals at which leads are arranged is decreased, it is difficult to precisely cut off the tie bars 21. Further, if the discrepancy between the punching die and the lead frame occurs, a part of each lead is punched as shown in FIG. 3 so that the shape of each lead is deteriorated. If the shape of each lead is greatly deteriorated, it is determined that the IC is a defective device.

In addition, if the lead frame 20 is not set at a regular position in the molding die in the resin encapsulation process, a relative discrepancy between the lead frame 20 and the package 10 occurs, so that the tie bars 21 are positioned close to the side surfaces of the package 10. If the tie bars 21 are cut off by the punching machine in this state, the side surfaces of the package 10 may be damaged by the punching die, so that it is determined that the IC is a defective device.

Further, to enable tie bars of the lead frame to be easily cut off, the lead frame as disclosed in Japanese Laid Open Patent Application No. 1-175250 has been proposed. In this lead frame, tie bars are formed so as to be pushed out from the surface of the leads in a direction of the thickness thereof by a distance equal to one third of the thickness of the lead frame. In the encapsulation process, when the lead frame is clamped by the molding dies, the tie bars are pushed back. As a result, a part of the border portion between each tie bar and a lead is partially broken. After the encapsulation process, the tie bars are completely punched out by the punching machine. According to such a lead frame, since the lead frame is punched under a condition in which a part of the border between each tie bar and a lead is broken, the punching pressure required for removing the tie bars from the lead frame can be decreased.

However, even if the above lead frame is used, it is still necessary to cut off the tie bars from the lead frame by the punching machine. Thus, the above problem regarding damage to the leads and/or the package by the punching machine is not completely eliminated.

SUMMARY OF THE INVENTION

Accordingly, a general object of the present invention is to provide a novel and useful lead frame and a production method for producing a semiconductor device using the lead frame in which the disadvantages of the aforementioned prior art are eliminated.

A specific object of the present invention is to provide a lead frame in which tie bars need not be cut off by a punching machine after a resin encapsulation process.

The above objects of the present invention are achieved by a lead frame comprising: a die pad on which a semiconductor chip is mounted; a plurality of leads each having an end which faces the die pad; and tie bars connecting the leads, wherein each of the tie bars is formed so as to project from a surface of each of the leads by an amount sufficient to break a boundary between a tie bar and a lead when the tie bar is pushed back so that the tie bar and lead are separated.

Another object of the present invention is to provide a production method for easily producing a high quality semiconductor device using the above lead frame.

The above objects of the present invention are achieved by a production method for producing a semiconductor device using a lead frame comprising a die pad on which a semiconductor chip is mounted, a plurality of leads each having an end which faces the die pad, and tie bars connecting the leads, wherein each of the tie bars is formed so as to project from a surface of each of the leads by an amount sufficient to break a boundary between a tie bar and a lead when the tie bar is pushed back so that the tie bar and lead is separated, the method comprising steps of: (a) clamping by molding dies the lead frame having the semiconductor chip mounted on the die pad so that the tie bar is pushed back and cut off and encapsulating the semiconductor chip by resin so that a package made of the resin is formed; and (b) releasing the lead frame from clamping by the molding dies and removing the tie bar pushed back by the clamping from the lead frame.

According to the present invention, when the lead frame is clamped by the molding dies in the encapsulation process, the tie bar is pushed back and the boundary between the tie bar and the lead is broken so that the tie bar is separated from the lead. Thus, it is not necessary to cut off the tie bar after the encapsulation process. As a result, a process for cutting off the tie bars can be omitted, so that the production cost of the semiconductor device can be decreased. In addition, the leads and the package are not damaged by the punching machine for cutting off the tie bars, so that the yield of the semiconductor device can be improved.

Additional objects, features and advantages of the present invention will become apparent from the following detailed description when read in conjunction with the accompanying drawings.

DESCRIPTION OF THE PREFERRED EMBODIMENT

A description will now be given of an embodiment of the present invention.

Figure 6:
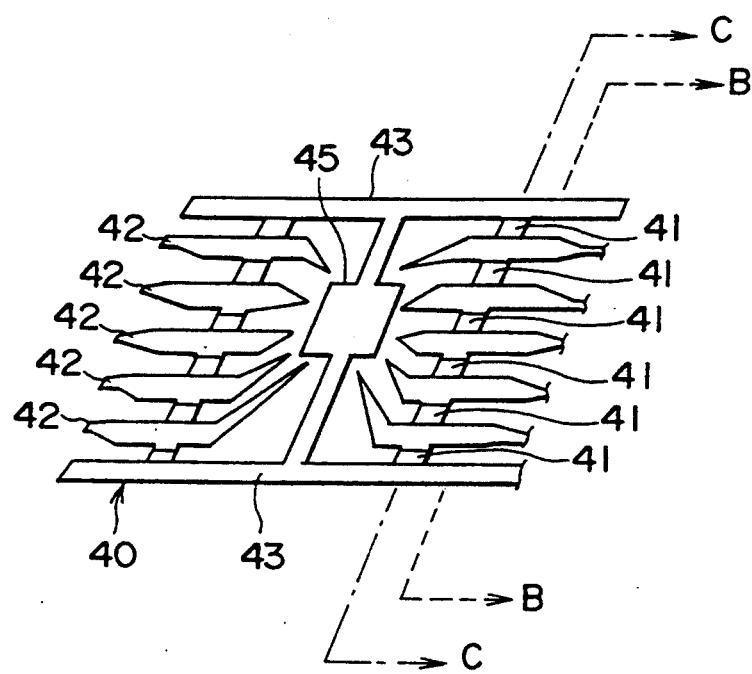
FIG. 6 is a perspective view showing the lead frame according to the embodiment of the present invention.

A plate made of material such as iron-nickel alloy or copper is punched as shown in FIG. 6, so that a lead frame according to the present invention is formed. Referring to FIG. 6, a lead frame 40 has a die pad 45 on which a semiconductor chip is to be mounted, leads 42 arranged such that respective ends thereof face the die pad 45 and tie bars 41 connecting the leads 42. The die pad 45 is connected to an outer frame 43 located on the circumference of the lead frame 40, and the leads positioned at both ends of a line in which the leads 42 are arranged are connected to the outer frame 43 by the tie bars 41. As a result, the die pad 45, the leads 42, the tie bars 41 and the outer frame 43 are integrated with each other so that the lead frame is formed.

Figure 8:
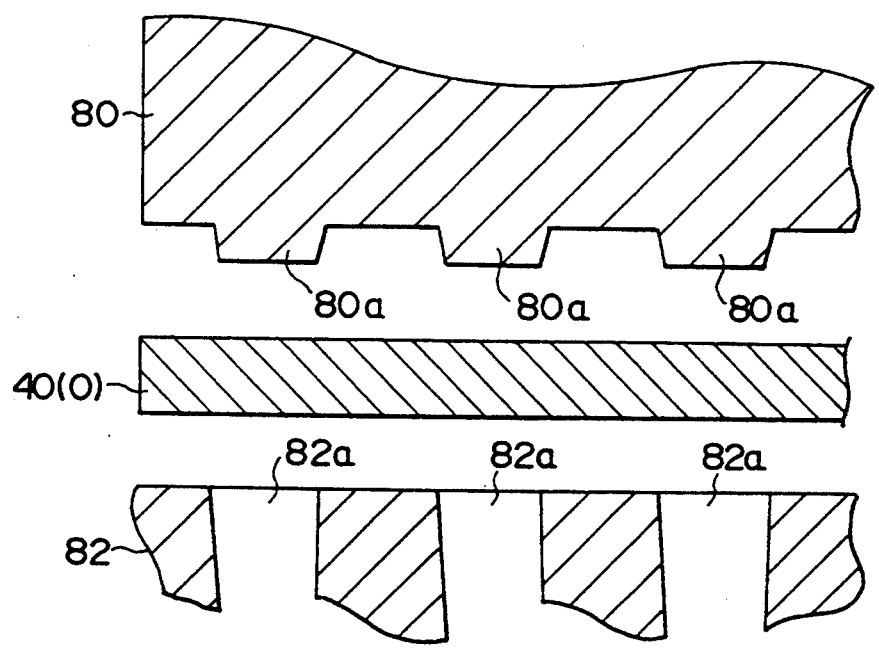
FIG. 8 is a cross sectional view showing a plate before it is punched into a lead frame.
Figure 9:
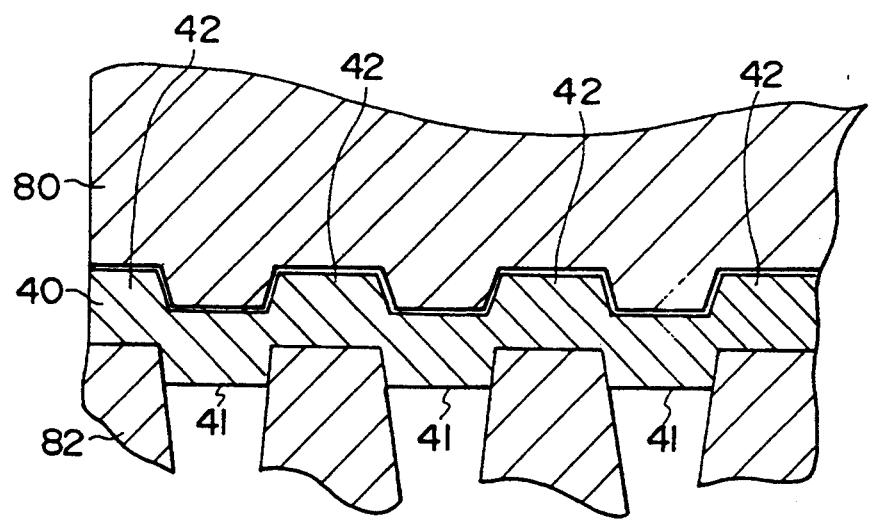
FIG. 9 is a cross sectional view showing a lead frame made by punching.

When the plate is punched, the tie bars 41 of the lead frame 40 are formed as shown in FIGS. 8 and 9. FIGS. 8 and 9 are cross sectional views taken along line C—C shown in FIG. 6.

Figure 1:
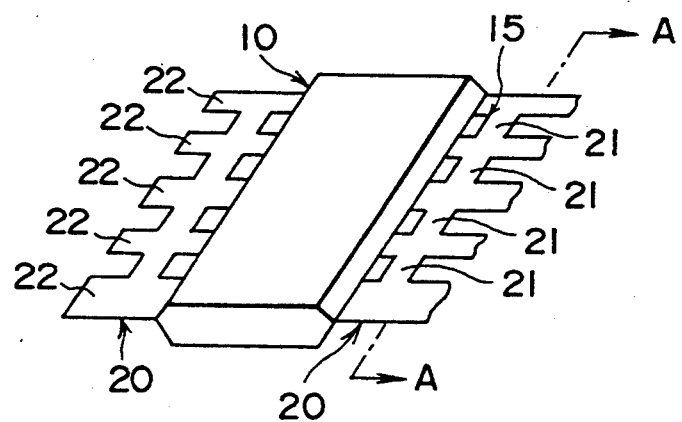
FIG. 1 is a diagram illustrating a conventional semiconductor device obtained in an encapsulating process.
Figure 2:
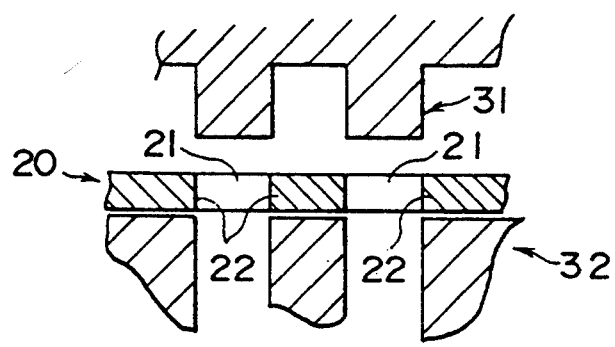
FIG. 2 is a cross sectional view showing a lead frame set in a cutting machine for cutting off tie bars.
Figure 3:
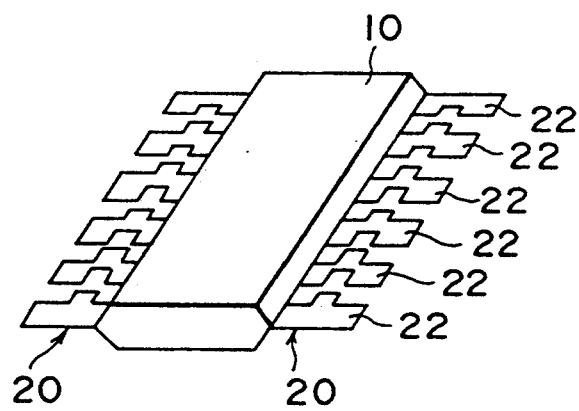
FIG. 3 is a diagram illustrating a semiconductor device produced under a condition in which the discrepancy between the punching die and the lead frame occurs.
Figure 4:
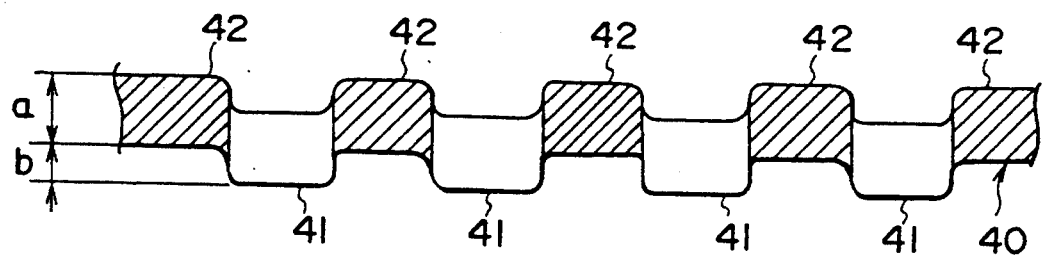
FIG. 4 is a cross sectional view showing a lead frame according to an embodiment of the present invention.
Figure 7:
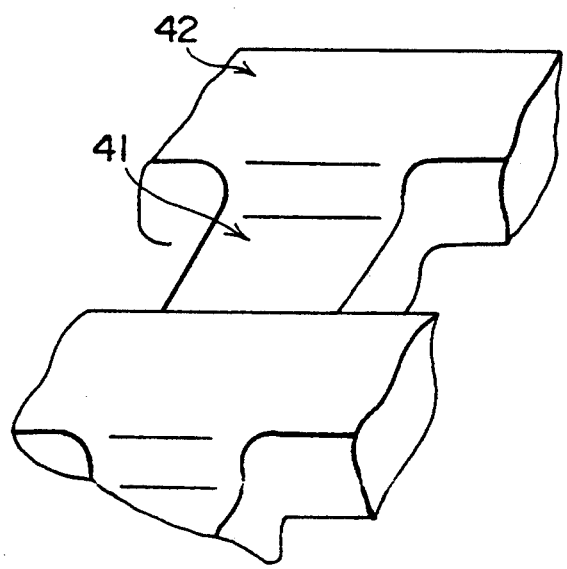
FIG. 7 is an enlarged perspective view showing the structure of a tie bar between leads.

Referring to FIG. 8, the plate 40(0) is set between a punching die 80 and a lower die 82 of a punching machine. The plate 40(0) is made of iron-nickel alloy described above and has a thickness of 0.25 mm. Convex parts 80a corresponding to the tie bars 41 are formed of the surface of the punching die 80. The height of each of the convex parts 80a is approximately equal to half the thickness of the plate 40(0). Concave portions 82a are formed on the surface of the lower die 82 so as to correspond to the convex parts 80a of the punching die 80. When the plate 40(0) is punched by the punching die 80, the tie bars 41 and the leads 42 are formed as shown in FIG. 9. That is, the height of each of the convex parts 80a of the punching die 80 is less than the thickness of the plate 40(0), so that tie bars 41 are pushed out from the surfaces of the leads 42 by the convex parts 80a and projecting parts of the tie bars enter into the concave portions 82a of the lower die 82. After this, when the punching die 80 and the lower die 82 are separated from each other, the lead frame 40 is formed as shown in FIG. 6, and each of the tie bars 41 is formed between leads 42 as shown in FIGS. 4 and 7. FIG. 4 shows a cross sectional view of the lead frame 40 taken along the B—B line shown in FIG. 6. FIG. 7 is a perspective view illustrating the structure of each of the tie bars 41 and the leads 42. That is, each of the tie bars 41 projects from a surface of each of the leads 42 in a direction of the thickness of the lead frame 40. The projection part of each of the tie bars 41 has a height (b) which is approximately half the thickness (a) of the lead frame 40.

An IC (a semiconductor device) is manufactured using the above lead frame 40.

Figure 5:
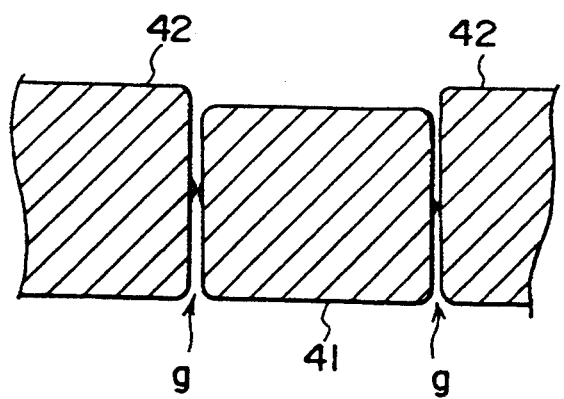
FIG. 5 is a cross sectional view the lead frame clamped by molding dies in a resin encapsulating process.
Figure 10:
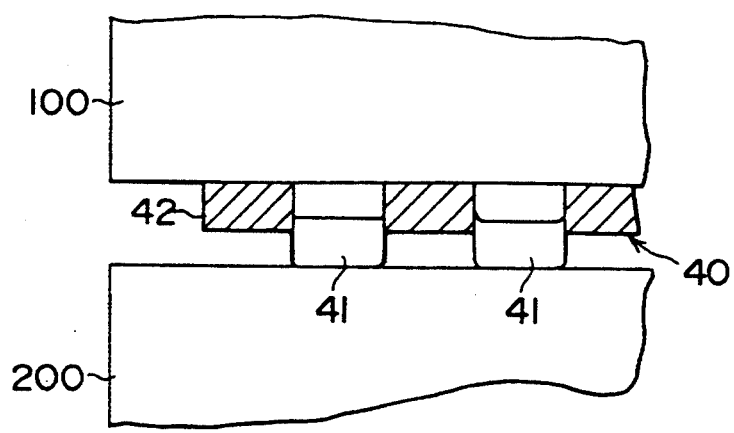
FIG. 10 is a diagram illustrating the lead frame set in molding dies.
Figure 11:
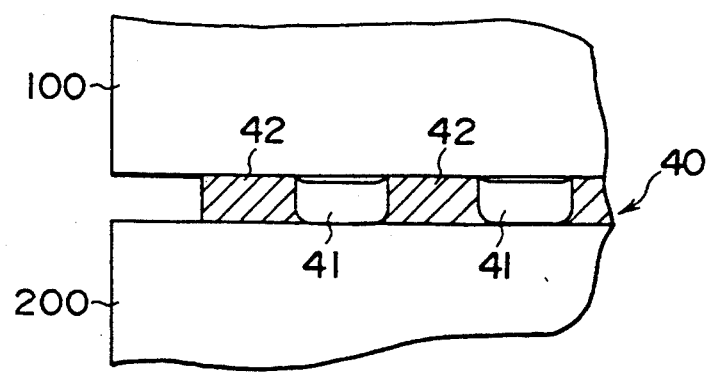
FIG. 11 is a diagram illustrating the lead frame clamped by the molding dies.

A semiconductor chip is bonded on the die pad 45, and electrode pads of the semiconductor chip are connected to the leads 42 by lead wires bonded thereto. In this state, the semiconductor device bonded on the die pad 45 of the lead frame 40 is encapsulated by resin. In the encapsulation process, the lead frame 40 on which the semiconductor chip is bonded is set between an upper die 100 and a lower die 200 of a molding machine, as shown in FIG. 10. The lead frame 40 is then clamped by the upper die 100 and the lower die 200 at a predetermined clamping pressure, as shown in FIG. 11. Under a condition in which the lead frame 40 is clamped by the upper die 100 and the lower die 200, the die bars 41 which have been projected from the surface of the leads 42 are pushed back by the clamping pressure such that the surface of the lower die 200 is uniformly brought into contact with the tie bars 41 and the leads 42. That is, the tie bars 41 are pushed back by a distance equal to approximately half the thickness (a) of the lead frame 40. When the tie bars 41 are pushed back as described above, the boundary between each of the tie bars 41 and each of the leads 42 connected thereto is cut. Since the tie bars 41 are pushed back by a distance equal to approximately half the thickness (a) of the lead fame 40, the tie bars 41 and the leads 42 are completely separated, as shown in FIG. 5.

Under a condition in which the lead frame 40 is clamped by the upper die 100 and the lower die 200, the resin is supplied to the molding machine, so that the semiconductor chip is encapsulated by the resin. At this time, the tie bars 41 are located between the leads 42 in the same manner as that of the conventional lead frame, so that the tie bars 41 prevent the resin from leaking from the gap between the upper die 100 and the lower die 200. In addition, a small gap (g) is formed between each tie bar and lead due to the separation of the tie bars 41 from the leads 42 (see FIG. 5), and the air in the cavity between the upper die 100 and the lower die 200 can leak therefrom through the small gap (g) when the molten resin is supplied to the cavity corresponding to the package. Thus, the cavity can be filled up with the molten resin. After the cavity is completely filled up with the molten resin, the upper die 100 and the lower die 200 are maintained to clamp the lead frame 40 for a predetermined time period. The upper die 100 and the lower die are then separated. At this time, the resin has been hardened, and the package made of the resin, in which package the semiconductor chip is encapsulated, is formed on the lead frame 40. The lead frame on which the package is formed is removed from the molding machine. At the end of the resin encapsulation process, the cut off tie bars 41 are adhered to the leads 42 by the resin burr.

Figure 12:
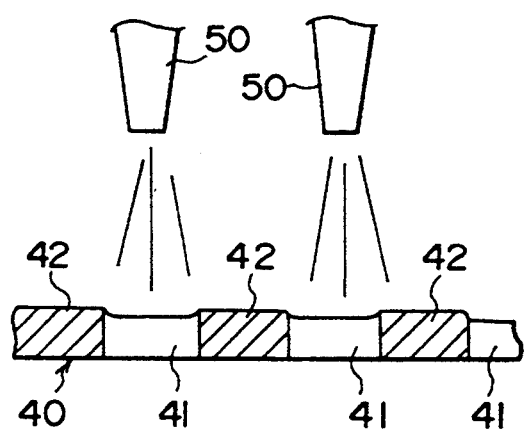
FIG. 12 is a diagram illustrating the lead frame from which tie bars are removed by a honing process.

After the resin encapsulation process is terminated, a honing process for removing the resin burr adhered to the surface of the lead frame 40 is carried out. In the honing process, as shown in FIG.12, high pressure water jetted from nozzles 50 is blown against the surface of the lead frame 40. As a result, the resin burr (the dam burr) adhered to the surface of the lead frame 40 is removed therefrom by the high pressured water. At this time, the tie bars 41 adhered to the leads 42 by the resin burr (the dam burr) are removed from the lead frame 40 along with the resin burr (the dam burr).

In the honing process, polishing powder may be included in the high pressure water jetted from the nozzles 50 (wet powder honing), and further, only the polishing power may be blown against the surface of the lead frame 40 (dry powder honing).

Figure 13:
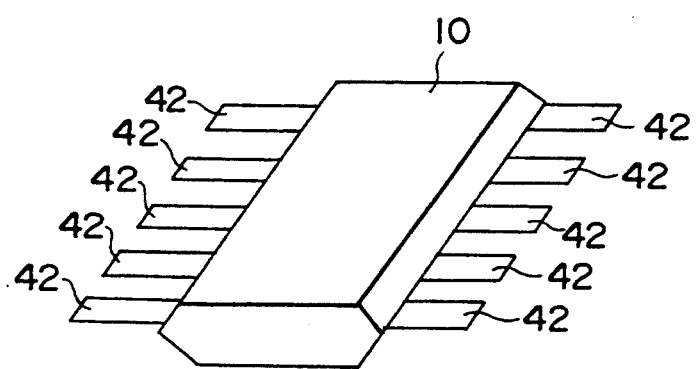
FIG. 13 is a diagram illustrating a semiconductor device produced using the lead frame shown in FIGS. 4 and 6.

After the above honing process is terminated, the IC having a shape in which the leads 42 project from both sides of the package 10 as shown in FIG. 13 is completed.

In the above embodiment, the tie bars 41 are removed from the lead frame 40 in the honing process. However, the present invention is not limited to such a process in which the tie bars are removed only in the honing process. In stead, a process for removing the tie bars 41 from the lead frame 40, for example, high pressure jetting water is blown against the tie bars 41, may be performed before the honing process.

In addition, a height (b) of the projection part of each tie bar 41 pushed out from the surface of each lead 42 may be of an amount of sufficient to break the boundary between the tie bar 41 and the lead 42 when the tie bar 41 is pushed back so that the tie bar 41 and the lead 42 are separated from each other. Thus, the height (b) of the projection part of each tie bar 41 may be equal to or greater than a half of the thickness (a) of the lead frame 40. In the light of easiness of pushing out and back of the tie bar 41, it is preferable that the rate (b/a) of the height (b) of the projection part of each tie bar 41 to the thickness (a) of the lead frame 40 be equal to $\frac{1}{2}$.

The present invention is not limited to the aforementioned embodiments, and variations and modifications may be made without departing from the scope of the claimed invention.

What is claimed is:

1. A method for producing a semiconductor device using a lead frame comprising a die pad on which a semiconductor chip is mounted, a plurality of leads each having an end which faces said die pad, and tie bars connecting said leads, wherein each of said tie bars is formed so as to project from a surface of each of said leads by an amount sufficient to break a boundary between a tie bar and a lead when the tie bar is pushed back so that the tie bar and lead are separated, said method comprising steps of:

(a) clamping by molding dies said lead frame having the semiconductor chip mounted on said die pad so that the tie bar is pushed back and cut off and encapsulating the semiconductor chip by resin so that a package made of the resin is formed; and (b) releasing said lead frame from clamping by the molding dies and removing the tie bar pushed back by the clamping from said lead frame.

2. The method as claimed in claim 1 wherein, in said step (b), said step of removing the tie bar from said lead frame is performed by a high pressure jet of water.

3. The method as claimed in claim 1, wherein said step (b) is performed along with a honing process.

* * * * *